(12) United States Patent
Uehara et al.

(10) Patent No.: US 7,733,138 B2
(45) Date of Patent: Jun. 8, 2010

(54) FALSE LOCK DETECTION MECHANISM FOR USE IN A DELAY LOCKED LOOP CIRCUIT

(75) Inventors: Gregory T. Uehara, Austin, TX (US); Ravikanth Suravarapu, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 852 days.

(21) Appl. No.: 11/226,687

(22) Filed: Sep. 14, 2005

(65) Prior Publication Data

US 2007/0057708 A1      Mar. 15, 2007

(51) Int. Cl.
    *H03L 7/06* (2006.01)
(52) U.S. Cl. .................................. 327/158; 327/149
(58) Field of Classification Search ......... 327/147–150, 327/153, 156–159
    See application file for complete search history.

(56) References Cited

U.S. PATENT DOCUMENTS

| | | | | |
|---|---|---|---|---|
| 6,037,812 | A * | 3/2000 | Gaudet | 327/116 |
| 6,259,290 | B1 * | 7/2001 | Takada et al. | 327/158 |
| 6,320,469 | B1 * | 11/2001 | Friedberg et al. | 331/1 A |
| 6,326,826 | B1 * | 12/2001 | Lee et al. | 327/161 |
| 6,504,408 | B1 * | 1/2003 | von Kaenel | 327/158 |
| 6,794,945 | B2 * | 9/2004 | McDonald et al. | 331/1 A |
| 6,844,761 | B2 | 1/2005 | Byun et al. | 327/149 |
| 6,970,047 | B1 * | 11/2005 | Johnson et al. | 331/45 |
| 7,015,725 | B1 | 3/2006 | Yu et al. | 327/12 |
| 7,015,727 | B2 * | 3/2006 | Balasubramanian | 327/49 |
| 7,034,591 | B2 | 4/2006 | Wang | 327/158 |

* cited by examiner

*Primary Examiner*—Hai L Nguyen
(74) *Attorney, Agent, or Firm*—Meyertons, Hood, Kivlin, Kowert & Goetzel, P.C.; Stephen J. Curran

(57) ABSTRACT

The delay locked loop circuit includes a charge pump circuit that may charge and discharge in response to an assertion of an up signal and a down signal, respectively. The delay locked loop circuit also includes a detection circuit that may assert the up signal indicating an occurrence of a transition of a first clock signal and may assert the down signal indicating an occurrence of a transition of a second clock signal. The delay locked loop circuit further includes a delay circuit that may provide a plurality of delayed clock signals and an additional delayed clock signal, each corresponding to a delayed version of the first clock signal. Further, a false lock circuit may provide a reset signal to the detection circuit dependent upon whether a predetermined number of successive clock edges associated with the delayed clock signals occur within a given clock cycle of the first clock signal.

18 Claims, 7 Drawing Sheets

FALSE LOCK DETECTION MECHANISM FOR USE IN A DELAY LOCKED LOOP CIRCUIT

BACKGROUND OF THE INVENTION

1. Field of the Invention

This invention relates to clock generation circuits and, more particularly, to delay locked loop circuits.

2. Description of the Related Art

Many circuits employ clock circuits that generate one or more clock signals having different frequencies from a reference clock. For example, a system may include reference clock generator or oscillator circuit that provides an output signal at a given frequency. The output signal may be used as a reference to generate any number of other clock signals for use in different parts of the system.

To generate the other clock signals with different frequencies, a frequency synthesizer such as a delay locked loop circuit, for example, may be used. More particularly, delay locked loop circuits are commonly used as clock multipliers capable of generating clocks having frequencies that are multiples of the reference clock frequency. However depending on the application, conventional phase/frequency detection circuits may sometimes exhibit false lock conditions during which the delay locked loop circuit may lock onto an incorrect edge of the feedback clock. As a result, the output signal may be incorrect.

SUMMARY

Various embodiments of a false lock detection mechanism for use in a delay locked loop are disclosed. In one embodiment, the delay locked loop circuit includes a charge pump circuit that may charge in response to an assertion of an up signal and may discharge in response to an assertion of a down signal. In addition, the delay locked loop circuit includes a detection circuit that may assert the up signal indicating an occurrence of a transition of a first clock signal and may also assert the down signal indicating an occurrence of a transition of a second clock signal. The delay locked loop circuit further includes a delay circuit that may provide a plurality delayed clock signals and an additional delayed clock signal, each corresponding to a delayed version of the first clock signal. Further, a false lock circuit may provide a reset signal to the detection circuit dependent upon whether a predetermined number of successive clock edges associated with the delayed clock signals occur within a given clock cycle of the first clock signal.

For example, in one specific implementation, the false lock circuit may provide a reset signal to the detection circuit in response to detecting an occurrence of less than the predetermined number of successive clock edges associated with the delayed clock signals within a given clock cycle of the first clock signal.

In another specific implementation, the false lock circuit may provide a reset signal to the detection circuit in response to detecting an occurrence of more than the predetermined number of successive clock edges associated with the delayed clock signals within a given clock cycle of the first clock signal.

Figure 1:
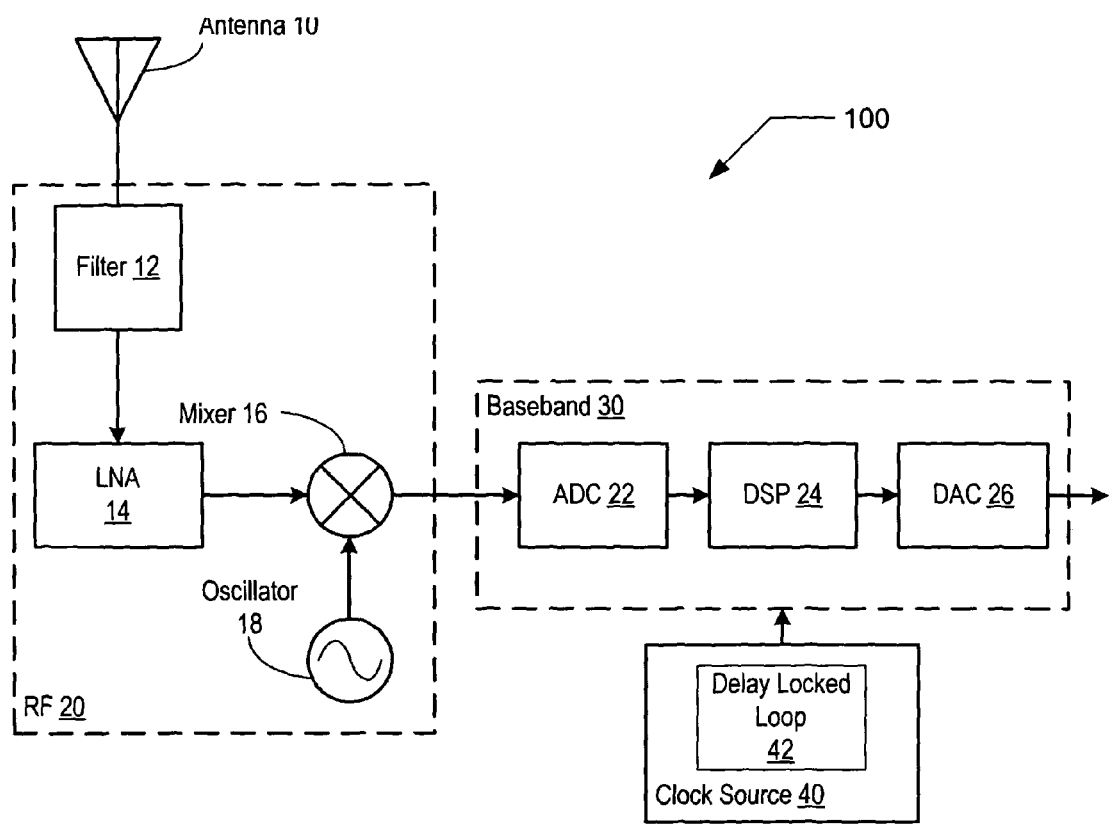
FIG. 1 is a generalized block diagram of one embodiment of a radio frequency receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a generalized block diagram of one embodiment of a radio frequency receiver is shown. Receiver 100 includes a radio frequency (RF) subsystem 20 that is coupled to a baseband subsystem 30 and to an antenna 10. Receiver 100 also includes a clock source 40, which is coupled to baseband subsystem 30. It is noted that receiver 100 may include other components and subsystems, which have been omitted for simplicity. It is also noted that, receiver 100 may be part of a wireless communication device such as a mobile telephone, for example.

In the illustrated embodiment, RF subsystem 20 includes a filter 12 that is coupled to antenna 10 and to a low noise amplifier (LNA) 14, which is in turn coupled to a mixer 16. Mixer 16 is also coupled to receive an output from oscillator 18. The output of mixer 16 is provided to baseband subsystem 30. Filter 12 may be configured as a pass band filter that may be tuned to selectively receive a particular range of frequencies. LNA 14 may be configured to amplify and provide the received signal to mixer 16. Mixer 16 may be configured to down-convert the received RF signal to the baseband frequency through the mixing process. In the illustrated embodiment, oscillator 18 may be a local oscillator that provides the mixing frequency to mixer 16.

Baseband subsystem 30 of FIG. 1 includes an analog-to-digital converter (ADC) 22 that is coupled to receive the down-converted signal from the RF section 20. ADC 22 may convert the analog signal to a digital representation. The digital representation is provided to digital signal processor (DSP) 24. Depending on the application, DSP 24 may perform various complex baseband algorithms and functions to process the signal. For example, in embodiments in which receiver 100 is part of a mobile telephone, DSP 24 may perform channel equalization and channel decoding, as well as speech decoding tasks. In various embodiments, a processed digital signal may be provided to digital-to-analog converter (DAC) 26. The converted analog signal may be, for example, an audio signal that may be provided to a speaker.

As described above, in various embodiments, baseband subsystem 30 may carry out complex digital signal processing functions. To carry out these functions, a number of different clock domains having precise clock edges may be needed by the baseband circuits. For example, in one embodiment, a clock-doubled reference clock may be used by DSP 24. Thus, a stable clock source such as clock source 40 may be employed to generate the clock signals used by baseband subsystem 30.

Accordingly, in the illustrated embodiment, clock source 40 includes a delay locked loop 42 for generating one or more clock signals that may be used by different circuits within baseband subsystem 30. As described in greater detail below in conjunction with the descriptions of FIG. 2 through FIG. 8, delay locked loop 42 may be implemented to include circuits to detect certain false lock conditions.

Figure 2:
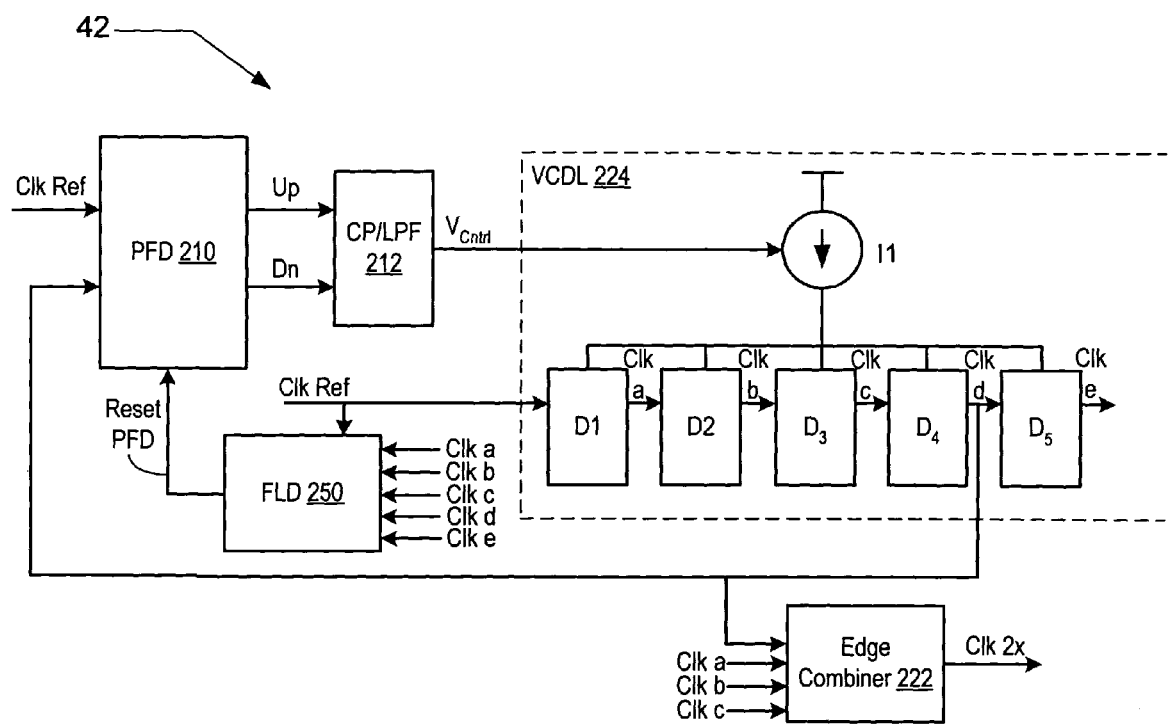
FIG. 2 is a block diagram of one embodiment of a delay locked loop circuit of the receiver of FIG. 1 including a false lock detection circuit.

Referring to FIG. 2, a block diagram of one embodiment of a delay locked loop including false lock detection is shown. It is noted that components corresponding to components shown in FIG. 1 are numbered identically for clarity and simplicity. Delay locked loop 42 includes a phase-frequency detector 210 that is coupled to receive a reference clock designated 'Clk Ref' and a feedback clock designated 'Clk d'. Clk Ref may be a reference clock signal provided by circuitry either internal to or external of receiver 100. Phase-frequency detector 210 is coupled to a charge pump/low pass filter (CP/LPF) 212. CP/LPF 212 is coupled to a voltage controlled delay line (VCDL) 224. One output of VCDL 224 is Clk d. Delay locked loop 42 also includes a feedback loop that routes Clk d back to one input of phase-frequency detector 210. Delay locked loop 42 also includes an edge combiner 222 that generates 'Clk 2×', which may be a clock-doubled version of Clk Ref, and a false lock detection circuit (FLD) 250 that is coupled to phase-frequency detector 210.

In the illustrated embodiment, VCDL 224 includes a delay chain having five delay elements, designated D1 through D5, that are coupled to a voltage controlled current source (I1). More particularly, delay elements D1 through D5 are connected to each other in a daisy chain arrangement such that each delay element is clocked by the output of the previous delay element, beginning with the Clk Ref clock signal. Thus a number of output clock signals having different delays may be generated by the delay chain. In the illustrated embodiment, each delay element generates a respective clock signal (e.g., clock signals Clk a, Clk b, Clk c, Clk d, and Clk e). In one embodiment, the total delay of the delay chain at the output of D5 is 5T/4, and the delay associated with the output of delay element D4 is T, where T is one clock period of Clk Ref. It is noted that in other embodiments, other numbers of delay elements may be used. The number of delay elements may determine the granularity and therefore the number of clock edges available to produce other clocks.

In one embodiment, delay elements D1 through D5 may include an intrinsic propagation delay at a given supply current (I1). The propagation "time" delay corresponds to the time that it takes a signal to propagate from the input to the output. When the supply current is increased or decreased the time delay may change. For example, in one embodiment, each delay element may include one or more inverter gates. When the supply current to the inverter gates is increased, the propagation time or "logic gate" delay for the delay element may decrease. Conversely, when the supply current to the inverter gates is decreased, the time delay for the delay element may increase. The latter condition is sometimes referred to as a current-starved condition. More particularly, increasing and decreasing the available current supplied to the gate terminal of transistors within the inverters, may increase and decrease the rate at which a capacitance associated with gate terminals may be charged and discharged, thereby decreasing or increasing the inverter gate delay, respectively. It is noted however, that in other embodiments other types of delay devices may be used.

In the illustrated embodiment, the edge combiner circuit 222 uses Clk a-Clk d to generate Clk 2×. Thus, the delay element D5 may be an extra delay element and may not be used to directly generate the output Clk 2×. However, as will be described in greater detail below in conjunction with the descriptions of FIG. 3 through FIG. 8, Clk e 30 may be used by FLD 250 to provide one or more control signals to phase-frequency detector 210 (e.g., Reset_PFD) such that the delay locked loop 42 may detect and correct for certain false lock conditions.

Figure 3:
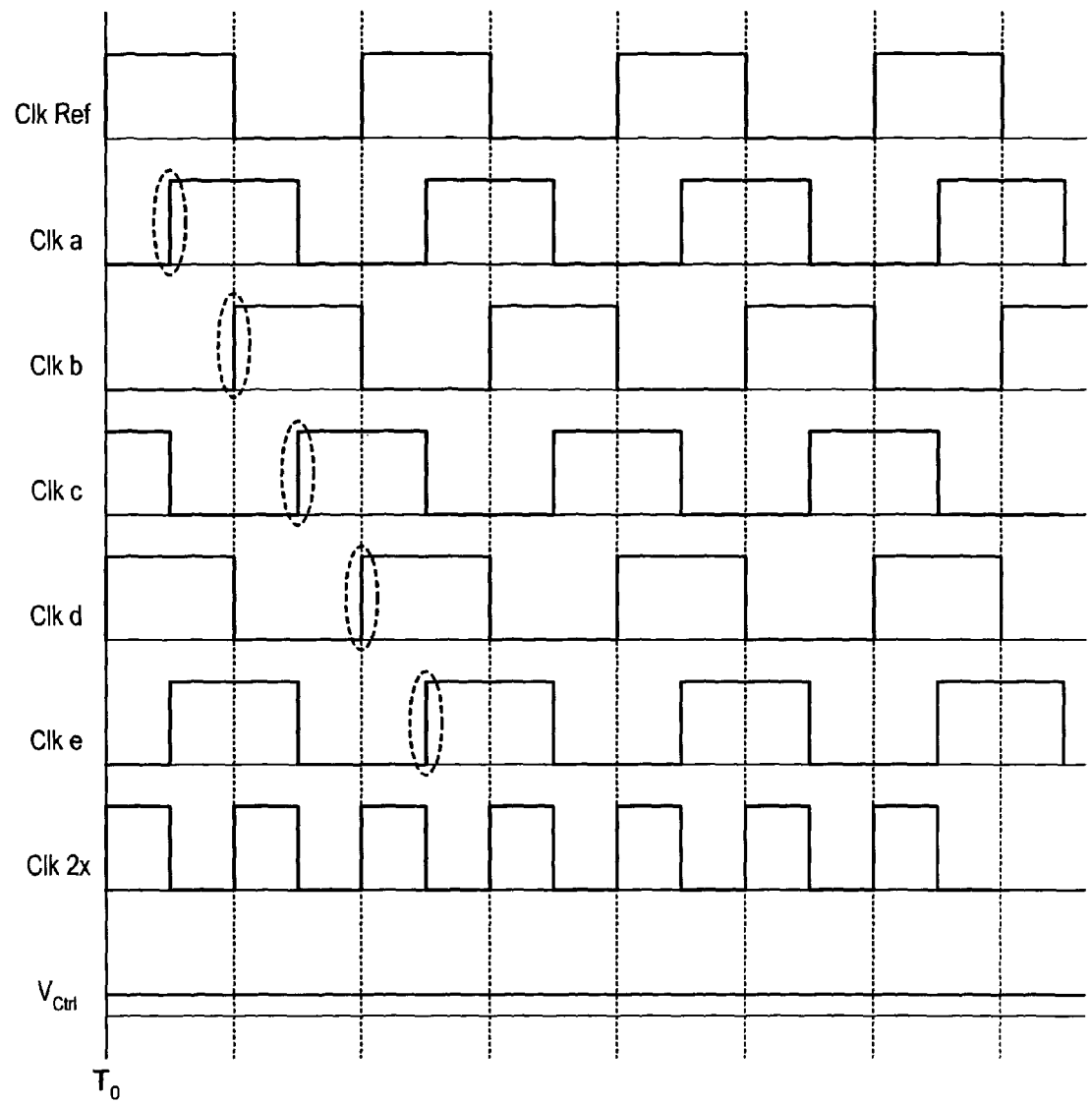
FIG. 3 is a timing diagram depicting exemplary waveforms of the delay locked 10 loop circuit of FIG. 2 in a steady-state locked condition.

FIG. 3 is a timing diagram that illustrates exemplary waveforms that may be produced by the embodiment of delay locked loop 42 shown in FIG. 2. The timing diagram depicts eight waveforms: Clk Ref, Clk a, Clk b, Clk c, Clk d, Clk e, Clk 2×, and $V_{Cntrl}$. As described above, Clk Ref may be a reference clock signal. Referring collectively to FIG. 2 and FIG. 3, the Clk a signal is the output of the first delay element D1 within VCDL 224. Likewise, the Clk b signal is the output of the second delay element D2 within VCDL 224, the Clk c signal is the output of the third delay element D3 within VCDL 224, the Clk d signal is the output of the fourth delay element D4 within VCDL 224, and the Clk e signal is the output of the fifth delay element D5 within VCDL 224. Clk 2× is the output of edge combiner 222, and as illustrated, Clk 2× is twice the frequency of Clk Ref. Thus, in this embodiment, delay locked loop 42 is being used as a clock doubler. The last signal is the $V_{Cntrl}$ signal provided to VCDL 224. It is noted that in other embodiments, other numbers of delay elements may be used resulting in other output frequencies.

Referring collectively to FIG. 2 and FIG. 3, delay locked loop 42 receives the Clk Ref signal and produces output clock (e.g., Clk 2×). In addition, the phase of the Clk 2× clock may be locked to the Clk Ref clock when delay locked loop 42 is operating in a steady-state locked condition, as shown. To obtain a locked condition, phase-frequency detector 210 detects the rising edges of the Clk Ref and the Clk d clocks and asserts the Up and Dn control signals dependent upon which clock signal edge arrives first (i.e., which clock signal edge is leading). The Up and Dn control signals may be used by the CP/LPF 212 to generate a control voltage '$V_{Cntrl}$' that controls the time delay of the delay line. Thus, by changing the delay of the delay line and thus the delay of Clk d, delay locked loop 42 may search for and lock onto the correct edge of Clk d. For example, as the propagation delay of the delay elements approaches an optimum value (e.g., a value which causes the total delay of Clk d to be one clock cycle of Clk Ref and the leading edges aligned), the duration the Up and Dn signals may be asserted may become shorter and shorter until such time that a locked condition is obtained. Thus, during the locked condition, the duration of the Up and Dn signals may be so short that they are substantially negligible.

In the embodiment shown in FIG. 3, $V_{Cntrl}$ is at a voltage level such that each of the delay elements provide an ideal time delay of approximately one fourth of the period of Clk Ref. Since Clk Ref drives the delay chain formed by the five delay elements, the total time delay is ideally 5/4 periods of Clk Ref. Thus, since the system is shown in a steady-state locked condition, the edges of Clk d, which is the output of the fourth delay element, are aligned with the edges of Clk Ref, the rising edge of Clk e is aligned with 5T/4 and each of the rising edges of Clk a through Clk c occur within one clock cycle of Clk Ref, as denoted by the dashed ovals. In addition, $V_{Cntrl}$ is at a voltage level which keeps the delays of delay elements substantially constant. Further, since edge combiner 222 may use the edges of one or more of the Clk a, Clk b, Clk c, and Clk d to generate Clk 2×, the correct alignment of the clock edges may allow edge combiner 222 to generate the Clk 2× signal with the proper pulse width and duty cycle. As shown, edge combiner 222 may generate Clk 2× according to the following equation (Clk_d•$\overline{Clk\_a}$)+(Clk_b•$\overline{Clk\_c}$)

As noted above, in an ideal locked condition, correct alignment of the proper edges may be important when generating clocks such as Clk 2×. However, conditions may arise, known as false lock conditions, that may cause the phase frequency detector 210 to lock or attempt to lock onto an incorrect edge of Clk d. As shown in FIG. 3, the correct edges of Clk d are aligned with Clk Ref, thereby generating a proper Clk 2× signal. In a false lock condition, Clk 2× may have an incorrect pulse width and duty cycle, for example.

Generally speaking, there are various false lock conditions that may be classified as either slow false lock or fast false lock conditions. When the rising edge of Clk d is delayed more than one clock period of Clk Ref, it may be considered a slow false lock condition. One example of a slow false lock condition occurs when Clk d is delayed by 2T, the delay locked loop 42 may still lock since the edges of Clk d and Clk Ref may be aligned. However, in such a condition, the edges of Clk a through Clk e may be improperly aligned. As such, one or more of the rising edges of Clk a-Clk e may fall outside the boundaries of one clock cycle of Clk Ref.

In contrast, when the delay of Clk d is less than T, a fast false lock condition may be present. As such, the rising edges of Clk a-Clk d and possibly even the rising edge of Clk e may fall within one clock cycle of Clk Ref. An example of a fast false lock condition may occur during initial circuit start up. During start up, if a rising edge of Clk Ref is encountered before VCDL 224 has initialized and before the rising edge of Clk d is encountered, $V_{Cntrl}$ may begin to ramp to decrease the delay of Clk d. However, since VCDL 224 has not yet initialized, the delay for Clk d could not change. As such, $V_{Cntrl}$ may overshoot the voltage level for a perfect lock. Now, a Clk Ref edge will always be encountered first causing PFD 210 to continually try to increase $V_{Cntrl}$ to decrease the delay of Clk d to T. Thus, $V_{Cntrl}$ may saturate to Vdd trying to obtain a lock in the wrong direction. Accordingly, circuits within PFD 210 and FLD 250 may allow delay locked loop 42 to detect and correct for various false lock conditions.

Figure 4:
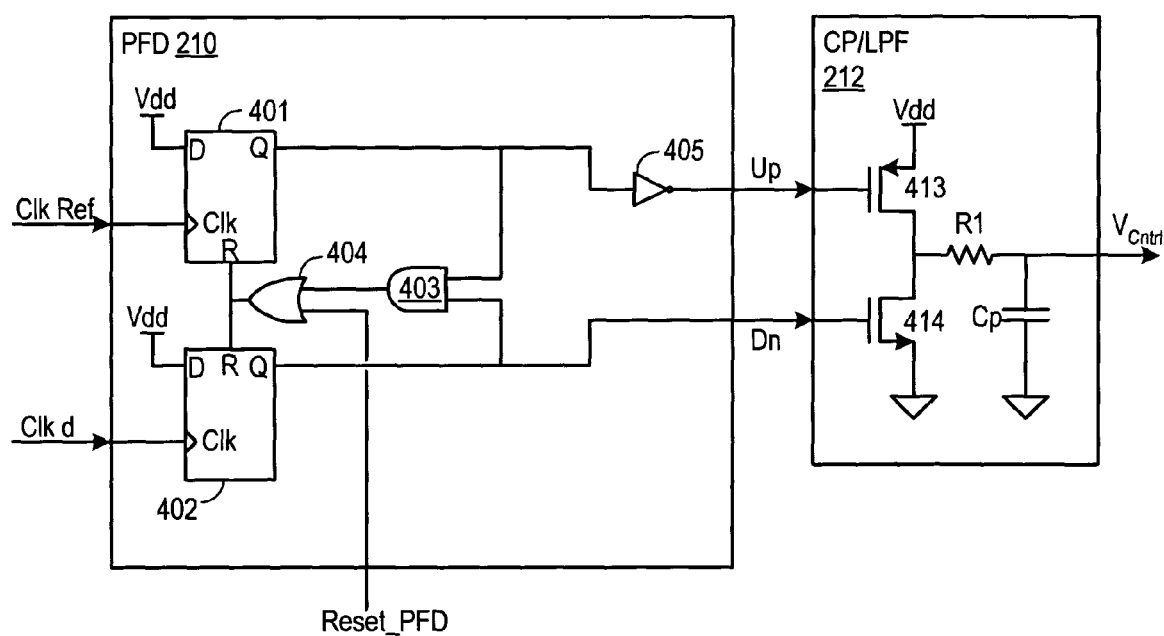
FIG. 4 is a block diagram illustrating detailed aspects of the embodiment of the delay locked loop circuit of FIG. 2.

Turning to FIG. 4, a block diagram illustrating detailed aspects of one 20 embodiment of phase frequency detector 210 and CP/LPF 212 of FIG. 2 are shown.

Phase frequency detector 210 includes D-type flip-flops designated 401 and 402 that are coupled to receive Clk Ref and Clk d, respectively. Phase frequency detector 210 also includes an AND gate 403 and an OR gate 404 that are coupled to provide a reset signal for both of flip-flops 401 and 402. The Q output of 401 is coupled to an inverter 405, the output of the inverter designated Up, is coupled to CP/LPF 212. Similarly, the Q output of 402, designated Dn, is also coupled to CP/LPF 212. It is noted that in other embodiments, other types of flip-flops or sequential logic circuits may be used.

In the illustrated embodiment, CP/LPF 212 includes a p-type metal oxide semiconductor (PMOS) transistor 413 and an n-type MOS (NMOS) transistor 414 that are coupled together in series between a supply voltage such as Vdd, and a reference node such as circuit ground, for example. In addition, CP/LPF 212 includes a resistor R1, one terminal of which is coupled to a node between the two transistors. The other terminal of R1 is coupled to an output node. CP/LPF 212 further includes a capacitor Cp that is coupled between the output node and the reference node. The control voltage $V_{Cntrl}$ is developed across capacitor Cp. Thus as described in greater detail below, in one embodiment, CP/LPF 212 is configured to charge capacitor Cp in response to an assertion of the Up signal and to discharge capacitor Cp in response to an assertion of the Dn signal. Accordingly, in the illustrated embodiment, current for charging and discharging capacitor Cp may be supplied through transistors 413 and 414. However, it is noted that in other embodiments, other types of current sources may be used. For example, in such embodiments, a first independent current source (not shown) may supply current to Cp from Vdd through transistor 413, and a second independent current source (not shown) may supply current from Cp to Gnd through transistor 414.

In the illustrated embodiment, the Clk Ref and Clk d signals clock flip-flops 401 and 402, respectively. Since the D input on each flip-flop is coupled to Vdd, each time a flip-flop is clocked, the Q output of that flip-flop goes to a high logic value such as Vdd, for example. Thus, in response to a rising edge of the Clk Ref signal, the Q output of flip-flop 401 goes to a logic high value. The high logic value causes the output of inverter 405 (i.e., Up signal) to transition to a logic low value. Similarly, in response to a rising edge of the Clk d signal, the Q output (i.e., Dn signal) of flip-flop 402 goes to a logic high value. In addition, when both the Up and Dn signals transition to a logic high value, AND gate 403 provides a logic high value to OR gate 404, which resets both flip-flops 401 and 402. Thus during operation, when PFD 210 detects transitions of both the Clk Ref and Clk d edges, PFD 210 may be reset for the current cycle of Clk ref. As will be described in greater detail below, in response to an assertion of the Reset_PFD signal (e.g., having a logic high value), both flip-flops 401 and 402 will be reset to enable PFD 210 to recover from a false lock condition.

As described above, CP/LPF 212 is configured to charge capacitor Cp in response to an assertion of the Up signal and to discharge capacitor Cp in response to an assertion of the Dn signal. In the illustrated embodiment, when the Up signal is at a logic low value, transistor 413 conducts, thus allowing capacitor Cp to charge from Vdd through resistor R1. Conversely, when the Dn signal is at a logic high value, transistor 414 conducts, thus allowing capacitor Cp to discharge through resistor R1 to circuit ground. As such, the control voltage $V_{Cntrl}$ may be increased and decreased by providing control signals Up and Dn to control the charging and discharging of capacitor Cp, respectively.

It is noted that the circuits illustrated in FIG. 4 are implementation details of one embodiment of PFD 210 and CP/LPF 212. It is contemplated that in other embodiments, other components and circuit configurations may be employed to achieve similar functionality.

Figure 5:
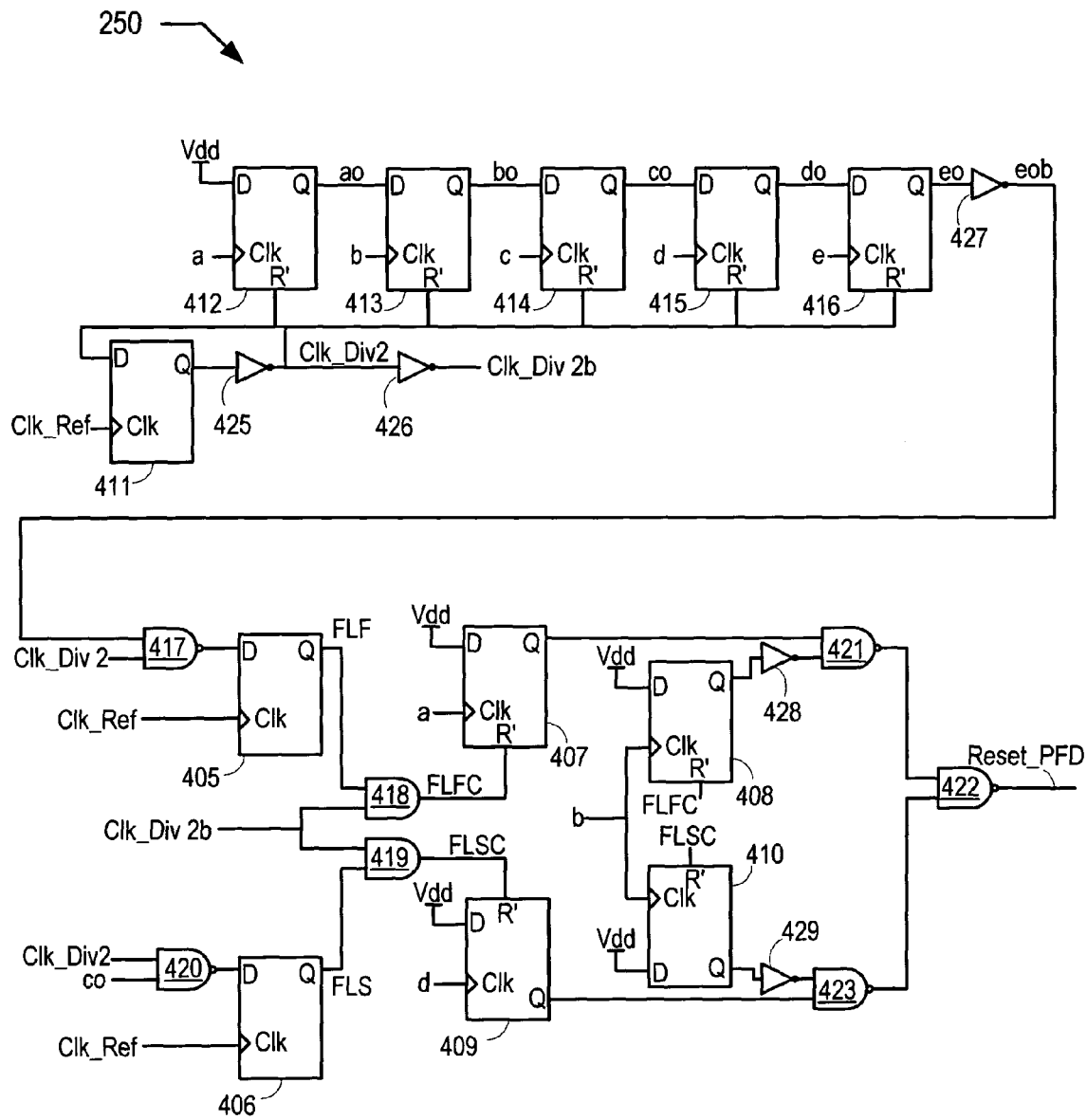
FIG. 5 is a diagram illustrating detailed aspects of one embodiment of the false lock detection circuit shown in FIG. 2.

Referring to FIG. 5, one embodiment of the false lock detection (FLD) circuit of FIG. 2 is shown. FLD 250 may be configured to count the number of successive clock edges of Clk a through Clk e within one period of Clk Ref. Depending on the number of clock edges detected, FLD 250 may cause flip-flops 401 and 402 within PFD 210 to be reset in response to a predetermined clock edge being detected. In addition, flip flops 401 and 402 may be held in reset until the rising edge of another predetermined clock signal is detected.

More particularly, in the illustrated embodiment, the upper portion of FLD 250 includes D-type flip-flops designated 412 through 416 arranged in a daisy chain in which the Q output of each flip-flop is an input to the next flip-flop. The D input of flip-flop 412 is coupled to Vdd. The output of flip-flop 416 is coupled to an inverter 427, the output of which is coupled to one input of a NAND gate 417. Each of flip-flops 412 through 416 is clocked by Clk a, Clk b, Clk c, Clk d, and Clk e, respectively. FLD 250 also includes a flip-flop 411 that is coupled to an inverter 425, which is in turn coupled to inverter 426. Flip-flop 411 is clocked by Clk Ref. The inverted output of flip-flop 411 is the Clk_Div2 signal, which is fed back to the D input, and which is inverted to create a Clk_Div2b signal. The Clk_Div2 signal is used to reset each of flip-flops 412 through 416.

The lower portion of FLD 250 includes flip-flops 405 through 410 and NAND gates 417, 420, 421, 422, and 423. In addition, FLD 250 includes AND gates 418 and 419. The output of NAND gate 417 is coupled to the D input of flip-flop 405. Similarly, the output of NAND gate 420 is coupled to the D input of flip-flop 406. Both of flip-flops 405 and 406 are clocked by Clk Ref. The output of flip-flop 405 designated the false lock fast (FLF) signal is coupled to one input of AND gate 418 and the output of flip-flop 406 designated the false lock slow (FLS) signal is coupled to one input of AND gate 419. The other input of both AND gates 418 and 419 are coupled to the Clk_Div2b signal. The output of AND gate 418 is coupled to reset flip-flop 407. Similarly, the output of AND gate 419 is coupled to reset flip-flop 409. Flip-flop 407 is clocked by Clk a, while flip-flop 409 is clocked by Clk d. Flip-flops 408 and 410 are clocked by Clk b. The Q output of flip-flop 407 is coupled to the input of NAND gate 421 and the Q output of flip-flop 408 is coupled to the input of NAND gate 421 via inverter 428. Similarly, the Q output of flip-flop 409 is coupled to the input of NAND gate 423 and the Q output of flip-flop 410 is coupled to the input of NAND gate 423 via inverter 429. The outputs of NAND gates 421 and 423 are coupled to the inputs of NAND gate 422, the output of which is the Reset_PFD signal.

As described above, in the illustrated embodiment, the daisy chain of flip-flops 412-416 latch the successive occurrences of Clk a through Clk e, respectively. More particularly, since each of flip-flops 412-416 are reset by a high to low transition of the Clk_Div2 signal, which is effectively Clk Ref divided by two, FLD 250 may count the successive occurrences of Clk a through Clk e. Depending on which of Clk a through Clk e have transitioned in one cycle of Clk Ref may determine if a false lock slow or fast condition is present. As such, depending on which clock edges have transitioned during one cycle of Clk Ref, the Reset_PFD signal may be asserted to reset PFD 210.

It is noted that the circuit components and configuration illustrated in the embodiment shown in FIG. 5 is but one implementation of FLD 250. It is contemplated that in other embodiments, other components and circuit configurations may be employed to achieve similar functionality.

Figure 6:
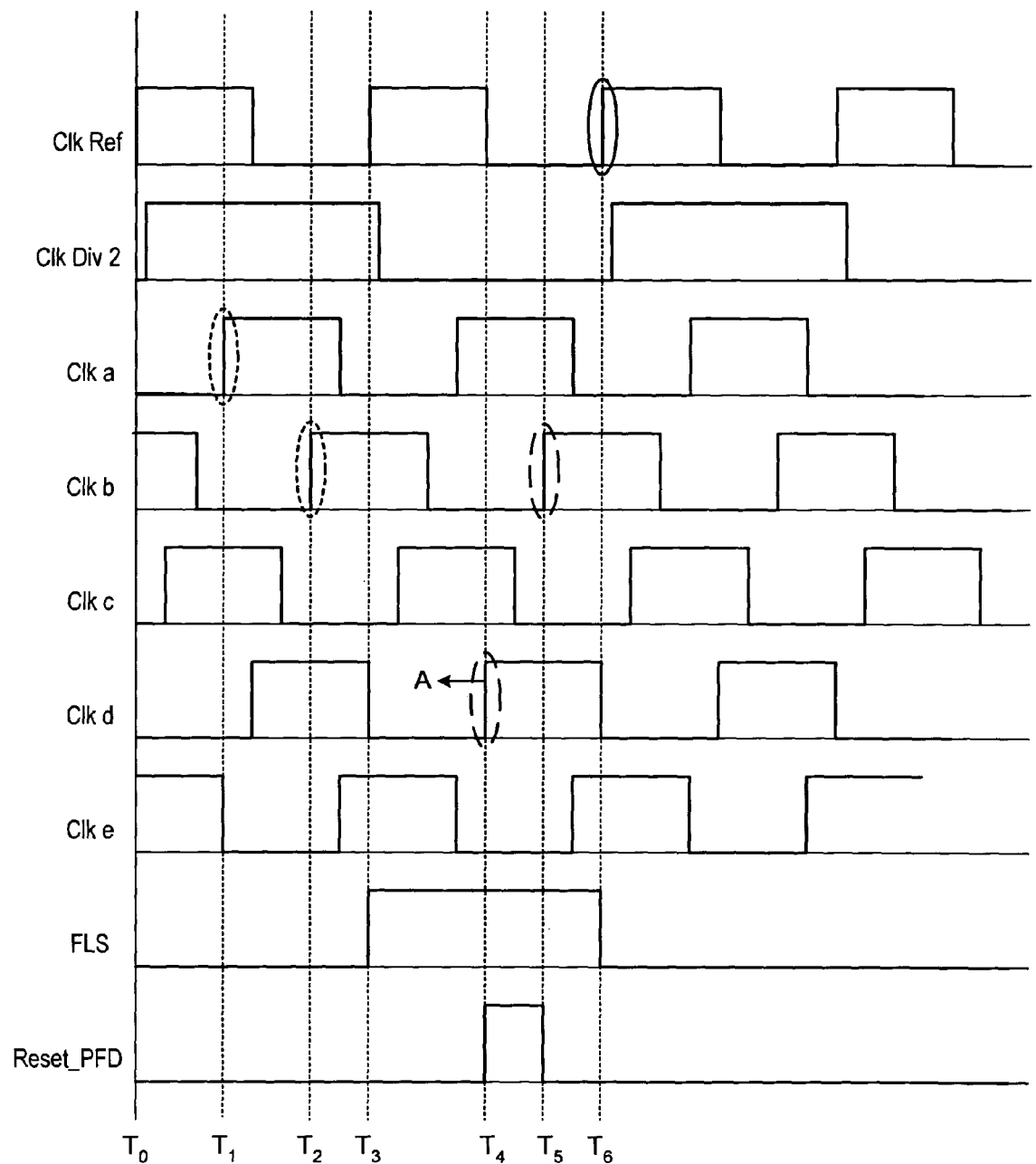
FIG. 6 is a timing diagram depicting exemplary waveforms of the delay locked loop circuits of FIG. 2, FIG. 4, and FIG. 5 in a non-locked condition.

FIG. 6 is a timing diagram depicting exemplary waveforms associated with the delay locked loop circuits of FIG. 2, and FIG. 4 and FIG. 5 in a false lock slow condition. The first waveform at the top of FIG. 6 is the Clk Ref signal and the second waveform is the Clk_Div2 signal, which is effectively the Clk Ref signal divided by two. The next five waveforms are Clk a, Clk b, Clk c, Clk d, and Clk e. The next waveform is the FLS signal and the last waveform is the Reset PFD signal.

As described above in conjunction with the description of FIG. 3, an ideal lock condition would have Clk d delayed by T such that Clk a, Clk b, and Clk c rising edges all transition within one cycle of Clk Ref. However as depicted in FIG. 6, at T4, the CLK d signal is delayed by 3T/2 clock cycles of Clk Ref. In this condition (e.g., a false lock slow condition) PFD 210 may continually detect the low to high transition of the Clk d signal before the low to high transition of the Clk Ref signal. In response, PFD 210 may assert the Dn signal each cycle in an effort to increase the delay of Clk d by decreasing $V_{Cntrl}$. Since the delay would have to decrease to have a proper lock, $V_{Cntrl}$ may saturate before the circuit ever locks, or the circuit may improperly lock when Clk d is delayed by 2T as described above.

However, to prevent the false lock condition from continuing, as shown in FIG. 6, during the first clock period of Clk Ref (e.g., from T0 to T3), flip-flops 412 and 413 of FIG. 5 successively latch the Clk a and Clk b signals (as denoted by the dashed ovals on the rising edges of those signals at T1 and T2, respectively. Accordingly, the signals a0 and b0 both transition from a low logic level to a high logic level. However, Clk c is not latched during the first clock cycle of Clk Ref. Thus, the signal c0 does not transition from a low logic level to a high logic level. Since c0 is at a low logic level, on the next rising edge of Clk Ref at T3, the FLS signal transitions from a low logic level to a high logic level at the Q output of flip-flop 406 (thus indicating a false lock slow condition). The FLS signal in combination with a Clk_Div2b signal that is at a high logic level causes a high logic level to be present at the reset inputs of flip-flops 409 and 410. This enables flip-flops 409 and 410 to latch the Clk d and Clk b signals at T4 and T5, respectively. Accordingly, at T4, the latching of the Clk d edge and the subsequent low to high transition of the Q output of flip-flop 409 causes the Reset_PFD signal to transition from a low to a high logic level. In contrast, at T5, the latching of the Clk b edge and the subsequent low to high transition of the Q output of flip-flop 410 causes the Reset_PFD signal to transition from a high to a low logic level. As described above, the Reset_PFD signal may cause the resetting of flip-flops 401 and 402 within the PFD 210. Thus, once flip-flops 401 and 402 are reset and released, the next rising edge that is encountered is the Clk Ref edge. Since PFD 210 now encounters the Clk Ref edge before the Clk d edge, PFD 210 may assert the Up signal to increase $V_{Cntrl}$, thereby decreasing the delay of Clk d. As such, the Clk d waveform should move in the direction indicated by the arrow labeled A. When the Clk d moves such that the delay is substantially equal to one clock cycle of Clk Ref, the circuit may be in a proper lock condition.

Figure 7:
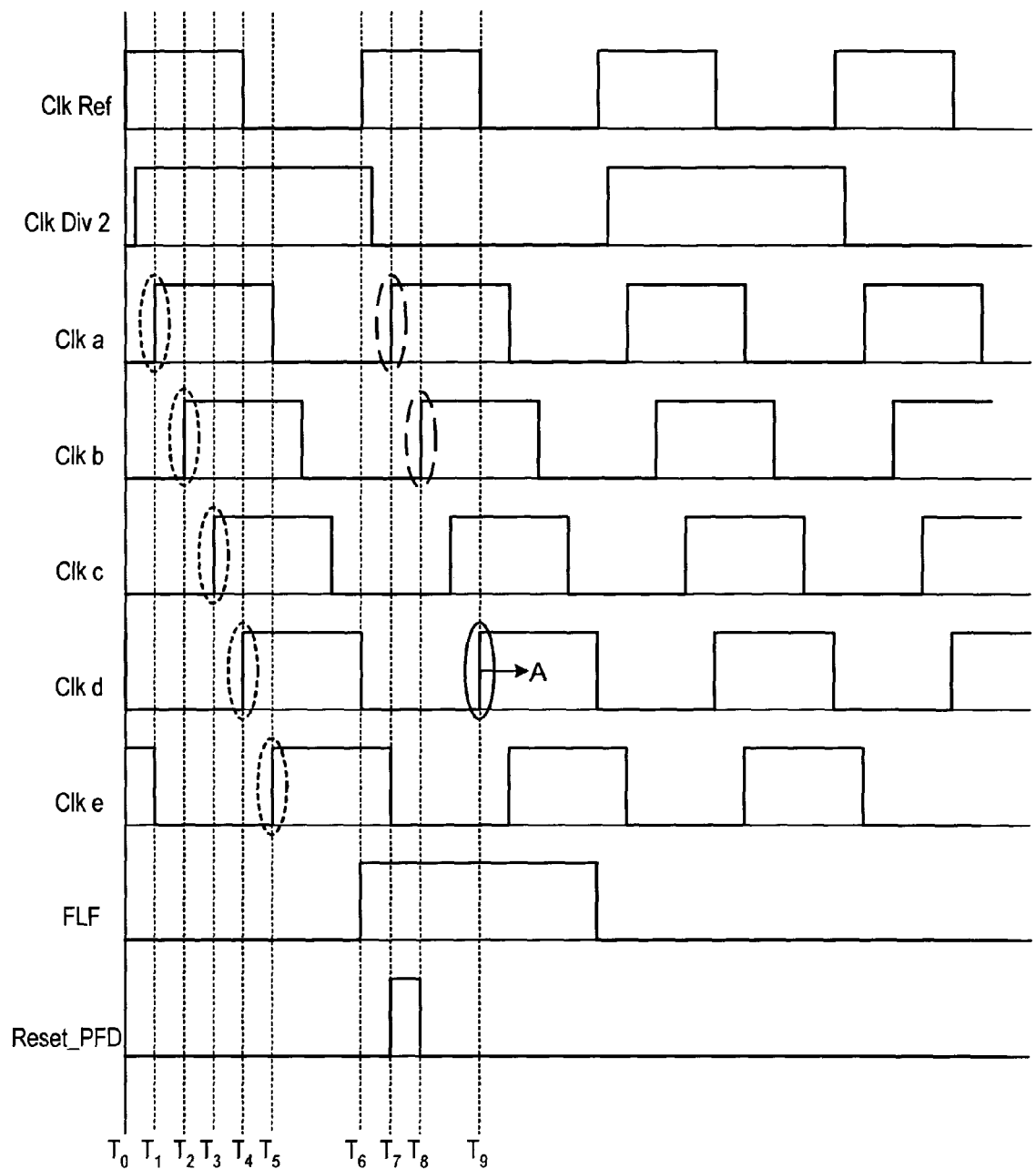
FIG. 7 is a timing diagram depicting exemplary waveforms of the delay locked loop circuits of FIG. 2, FIG. 4, and FIG. 5 in a different non-locked condition.

FIG. 7 is a timing diagram depicting exemplary waveforms associated with the delay locked loop circuit of FIG. 2, and FIG. 4, FIG. 5 in a false lock fast condition. It is noted that the waveforms depicted in FIG. 7 are similar to those depicted in FIG. 6. However in FIG. 7, an FLF waveform is shown lieu of an FLS waveform. More particularly, the first waveform at the top of FIG. 7 is the Clk Ref signal and the second waveform is the Clk_Div2 signal. The next five waveforms are Clk a, Clk b, Clk c, Clk d, and Clk e. The next waveform is the FLF signal and the last waveform is the Reset PFD signal.

As described above, an ideal lock condition would have Clk d delayed by T such that Clk a, Clk b, and Clk c rising edges all transition within one cycle of Clk Ref.

However as depicted in FIG. 7, at T4, the CLK d signal is delayed by T/2 clock cycles of Clk Ref. In this condition (e.g., a false lock fast condition) PFD 210 may continually detect the low to high transition of the Clk Ref signal before the low to high transition of the Clk d signal. In response, PFD 210 may assert the Up signal each cycle in an effort to decrease the delay of Clk d by increasing $V_{Cntrl}$. Since the delay would have to increase to have a proper lock, $V_{Cntrl}$ may saturate before the circuit ever locks as the delay of Clk d approaches zero.

To prevent the false lock condition from continuing, as shown in FIG. 7, during the first clock period of Clk Ref (e.g., from T0 to T6), flip-flops 412 through 416 of FIG. 5 successively latch the Clk a through Clk e signals (as denoted by the dashed ovals on the rising edges of those signals at T1 through T5, respectively. Accordingly, the signals a0 though e0 transition from a low logic level to a high logic level. The transition of e0 from a low logic level to a high logic level causes the eob signal to transition from a high logic level to a low logic level. Since eob is at a low logic level, on the next rising edge of Clk Ref at T6, the FLF signal transitions from a low logic level to a high logic level at the Q output of flip-flop 405 (thus indicating a false lock fast condition). The FLF signal in combination with a Clk_Div2b signal that is at a high logic level causes a high logic level to be present at the reset inputs of flip-flops 407 and 408. This enables flip-flops 407 and 408 to latch the Clk a and Clk b signals at T7 and T8, respectively. Accordingly, at T7, the latching of the Clk a edge and the subsequent low to high transition of the Q output of flip-flop 407 causes the Reset_PFD signal to transition from a low to a high logic level. In contrast, at T8, the latching of the Clk b edge and the subsequent low to high transition of the Q output of flip-flop 408 causes the Reset_PFD signal to transition from a high to a low logic level. As described above, the Reset_PFD signal may cause the resetting of flip-flops 401 and 402 within the PFD 210. Thus, once flip-flops 401 and 402 are reset and released, the next rising edge that is encountered is the Clk d edge at T9. Since PFD 210 now encounters the Clk d edge before the Clk Ref edge, PFD 210 may assert the Dn signal to decrease $V_{Cntrl}$, thereby increasing the delay of Clk d. As such, the Clk d waveform should move in the direction indicated by the arrow labeled A. When the Clk d edge moves such that the delay is substantially equal to one clock cycle of Clk Ref, the circuit may be in a proper lock condition.

Although the embodiments above have been described in considerable detail, numerous variations and modifications will become apparent to those skilled in the art once above disclosure is fully appreciated. It is intended that the following claims be interpreted to embrace all such variations and modifications.

What is claimed is:

1. A delay locked loop circuit comprising:
    a charge pump circuit configured to charge in response to an assertion of an up signal and to discharge in response to an assertion of a down signal;
    a delay circuit configured to provide a plurality of delayed clock signals and an additional delayed clock signal, each corresponding to a delayed version of a first clock signal;
    a detection circuit coupled to the delay circuit and configured to assert the up signal indicating an occurrence of a transition of the first clock signal and to assert the down signal indicating an occurrence of a transition of a particular delayed clock signal of the plurality of delayed clock signals; and
    a false lock circuit configured to provide a reset signal to reset the detection circuit in response to detecting an occurrence of more than a predetermined number of successive clock edges associated with the delayed clock signals within a given clock cycle of the first clock signal, and in response to detecting an occurrence of less than the predetermined number of successive clock edges associated with the delayed clock signals within a given clock cycle of the first clock signal.

2. The circuit as recited in claim 1, further comprising an output clock generation circuit configured to generate an output clock signal having a frequency that is a multiple of the frequency of the first clock signal by combining at least a portion of the delayed clock signals.

3. The circuit as recited in claim 1, wherein the detection circuit comprises a first flip-flop configured to assert the up signal in response to a transition of the first clock signal and a second flip-flop configured to assert the down signal in response to a transition of the particular delayed clock signal.

4. The circuit as recited in claim 3, further comprising a reset circuit configured to reset the first flip-flop and the second flip-flop in response to a transition of the reset signal.

5. The circuit as recited in claim 3, further comprising a reset circuit configured to reset the first flip-flop and the second flip-flop in response to concurrent assertion of both the up signal and the down signal.

6. The circuit as recited in claim 1, wherein the delay circuit includes a plurality of controlled delay elements, each configured to provide a respective one of the delayed clock signals, and wherein the delay circuit further includes an additional controlled delay element configured to provide the additional delayed clock signal.

7. The circuit as recited in claim 6, wherein the false lock circuit is further configured to use the additional delayed clock signal to detect a false lock condition.

8. The circuit as recited in claim 6, wherein each of the controlled delay elements and the additional controlled delay element is associated with a propagation delay that is controlled by a control voltage provided to delay circuit.

9. The circuit as recited in claim 8, wherein the charge pump circuit is further configured to generate the control voltage, dependent upon a duration of the assertion of the up and down signals.

10. A method comprising:
    charging a charge pump circuit in response to an assertion of an up signal and discharging the charge pump circuit in response to an assertion of a down signal;
    a delay circuit providing a plurality of delayed clock signals and an additional delayed clock signal, each corresponding to a delayed version of a first clock signal;
    a detection circuit asserting the up signal to indicating an occurrence of a transition of the first clock signal and asserting the down signal indicating an occurrence of a transition of a particular delayed clock signal of the plurality of delayed clock signals; and
    a false lock circuit providing a reset signal to and resetting the detection circuit in response to detecting an occurrence of more than a predetermined number of successive clock edges associated with the delayed clock signals within a given clock cycle of the first clock signal, and in response to detecting an occurrence of less than the predetermined number of successive clock edges associated with the delayed clock signals within a given clock cycle of the first clock signal.

11. The method as recited in claim 10, further comprising an output clock generation circuit generating an output clock signal having a frequency that is a multiple of the frequency of the first clock signal by combining at least a portion of the delayed clock signals.

12. The method as recited in claim 10, further comprising a first flip-flop within the detection circuit asserting the up signal in response to a transition of the first clock signal and a second flip-flop within the detection circuit asserting the down signal in response to a transition of the particular delayed clock signal.

13. The method as recited in claim 12, further comprising a reset circuit resetting the first flip-flop and the second flip-flop in response to concurrent assertion of both the up signal and the down signal.

14. The method as recited in claim 12, further comprising a reset circuit resetting the first flip-flop and the second flip-flop in response to a transition of the reset signal.

15. The method as recited in claim 5, further comprising a plurality of controlled delay elements, each providing a respective one of the delayed clock signals, and an additional controlled delay element providing the additional delayed clock signal.

16. The method as recited in claim 15, further comprising controlling a propagation delay associated with each of the controlled delay elements and the additional controlled delay element using a control voltage.

17. The method as recited in claim 16, further comprising the charge pump circuit generating the control voltage dependent upon a duration of the assertion of the up and down signals.

18. The method as recited in claim 15, further comprising the false lock circuit using the additional delayed clock signal for detecting a false lock condition.

* * * * *